(12) United States Patent
Liu et al.

(10) Patent No.: US 7,144,562 B2
(45) Date of Patent: Dec. 5, 2006

(54) SYNTHESIS OF LIBC AND HOLE-DOPED $LI_{1-x}BC$

(75) Inventors: Kai Liu, Davis, CA (US); Peter Klavins, Davis, CA (US); Limin Zhao, Davis, CA (US)

(73) Assignee: The Regents of The University of California, Oakland, CA (US)

( * ) Notice: Subject to any disclaimer, the term of this patent is extended or adjusted under 35 U.S.C. 154(b) by 369 days.

(21) Appl. No.: 10/718,491

(22) Filed: Nov. 19, 2003

(65) Prior Publication Data

US 2006/0237692 A1   Oct. 26, 2006

Related U.S. Application Data

(60) Provisional application No. 60/428,068, filed on Nov. 20, 2002.

(51) Int. Cl.
   *C01B 35/00*   (2006.01)
(52) U.S. Cl. ..................... 423/276; 505/150
(58) Field of Classification Search ........... 505/150; 423/279, 276
   See application file for complete search history.

(56) References Cited

OTHER PUBLICATIONS

J. Nagamatsu, N. Nakagawa, T. Muranaka, Y. Zenitani, and J. Akimitsu; "Superconductivity at 39K in magnesium diboride," Nature, Mar. 1, 2001, pp. 63-64, vol. 410.

H. Rosner, A. Kitaigorodsky, and W.E. Pickett; "Prediction of High Tc Superconductivity in Hole-Doped LiBC," Phyical Review Letters, Mar. 25, 2002, pp. 127001-1-127001-4, vol. 88, No. 12.

M. Worle, R. Nesper, G. Mair, M. Schwarz, H.G. Von Schnering; "LiBC—A Completely Intercalated Heterographite," Z. Anorg. Allg. Chem., 1995, pp. 1153-1159, vol. 621, (Abstract translated in English), no month.

M. Worle, R. Nesper; "MGB2C2, a new graphite-related refractory compound," Journal of Alloys and Compounds, 1994, pp. 75-83, vol. 216, no month.

(Continued)

*Primary Examiner*—Wayne A. Langel
(74) *Attorney, Agent, or Firm*—James M. Ritchey (57) ABSTRACT

Methods are described for synthesizing stoichiometric LiBC and hole doped $Li_{1-x}BC$ (lithium borocarbide) according to heating processes, such as by both an arc-melting method and a sealed tantalum ampoule method. The arc-melting method requires forming a pellet of uniformly-mixed elemental lithium, boron, and graphite and subjecting it to an arc-melt process sufficient to trigger a self-propagating exothermic reaction. Alternatively, the titanium ampoule method requires sealing uniformly-mixed elemental lithium, boron, and graphite (Li—B—C) in a tantalum ampoule; and heating under sufficient temperature for a sufficient period of time. Hole-doped $Li_{1-x}BC$ ($0 \leq x \leq 0.37$) can then be produced, such as through vacuum de-intercalation from the LiBC. According to the present invention, the hexagonal crystal lattice remains largely intact, with only slight decreases in lattice parameters upon hole-doping. The samples are intrinsically diamagnetic and are semiconducting in the 2 K to 300 K range studied.

53 Claims, 6 Drawing Sheets

OTHER PUBLICATIONS

R. Nesper; "Structure and Chemical Bonding in Zintl-Phases Containing Lithium," Solid St. Chem., 1990, pp. 1-45, vol. 20, no month.

A.V. Pronin, K. Pucher, P. Lunkenheimer, A. Krimmel and A. Loidl; "Electronic and optical properties of LiBC," cond-mat/0207299 Jul. 11, 2002, pp. 1-4, vol. 1.

J. Akimitsu, K. Takenawa, K. Suzuki, H. Harima, Y. Kuramoto; "High-Temperature Ferromagnetism in $CaB_2C_2$," Science, 2001, pp. 1125-1127, vol. 293, no month.

L. Zhao, P. Klavins and Kai Lui; "Synthesis and properties of hole-doped $Li_{1-x}BC$," Journal of Applied Physics, May 15, 2003, pp. 8653-8655, vol. 93, No. 10.

"Breakthrough of the Year," Science, Dec. 21, 2001, pp. 2443-2447, vol. 294.

J.M. An, S.Y. Savrasov, H. Rosner and W.E. Pickett; "$Li_xBC$ and $MgB_2$: Extreme Aspects of Electron-Phonon Coupling," Jun. 10, 2002, pp. 1-4.

J. Hlinka, I. Gregora, A.V. Pronin and A. Loidl; "LiBC by Polarized Raman Spectroscopy: Evidence for Lower Crystal Symmetry," Jul. 30, 2002, pp. 1-4, vol. V1.

SYNTHESIS OF LIBC AND HOLE-DOPED LI$_{1-x}$BC

CROSS-REFERENCE TO RELATED APPLICATIONS

This application claims priority from U.S. provisional application Ser. No. 60/428,068 filed on Nov. 20, 2002, incorporated herein by reference in its entirety.

STATEMENT REGARDING FEDERALLY SPONSORED RESEARCH OR DEVELOPMENT

Not Applicable

REFERENCE TO A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to borocarbide synthesis, and more particularly to methods of synthesizing LiBC and Li$_{1-x}$BC.

2. Description of Related Art

Figure 1:
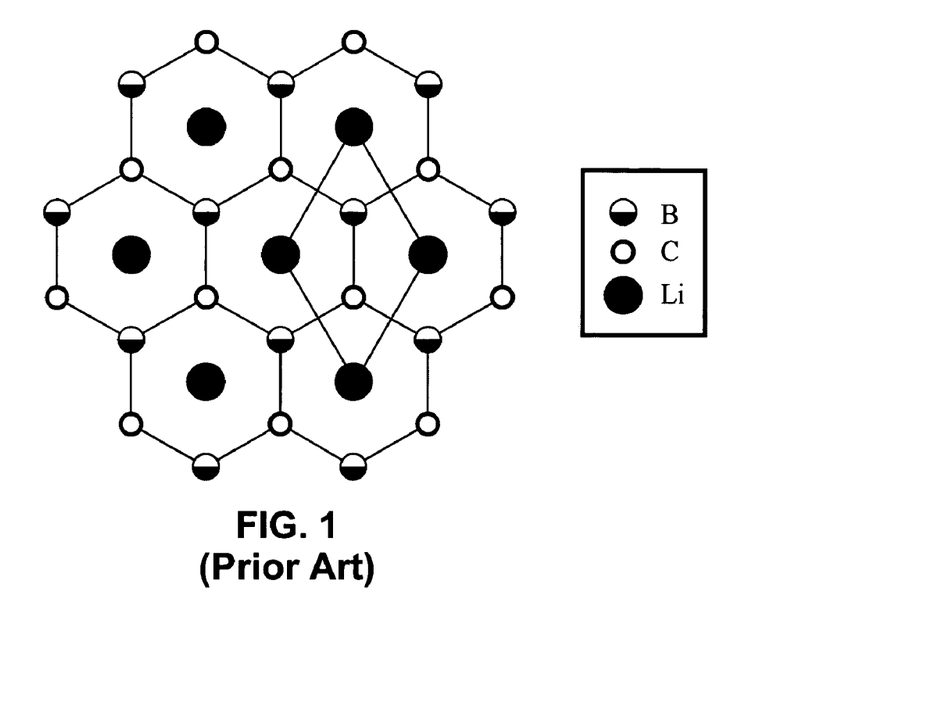
FIG. 1 is a diagram of LiBC crystal structure shown in two dimensions.
Figure 2:
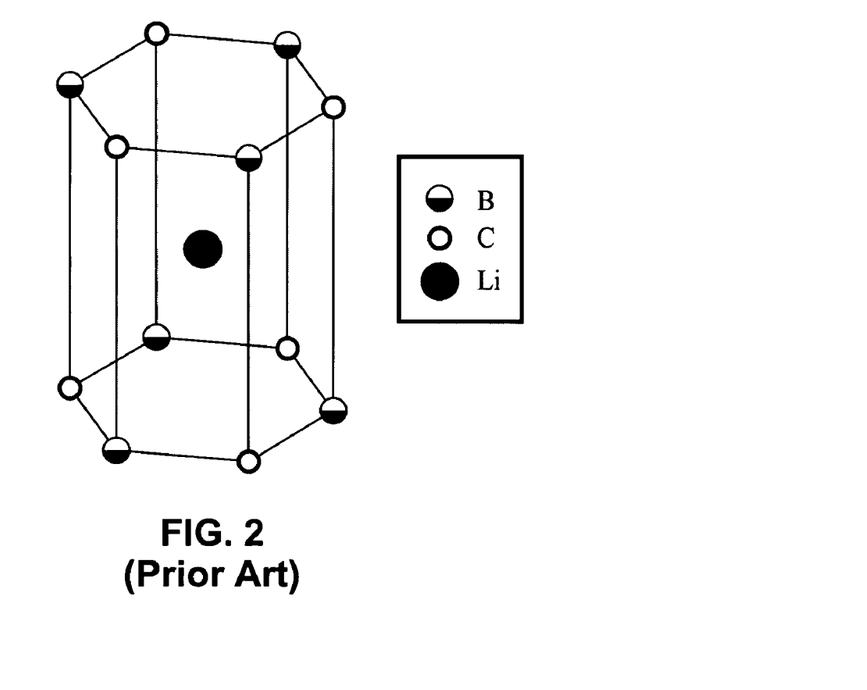
FIG. 2 is a diagram of adjacent lattice tiers in an LiBC crystal structure shown in three dimensions.

Layered diboride compounds have been the focus of intense interest since the discovery of superconductivity in MgB$_2$ (see J. Nagamatsu, N. Nakagawa, T. Muranaka, and J. Akimitsu, Nature 410, 63 (2001), incorporated by reference herein). A derived class of materials is the similarly layered borocarbides. Of particular interest are the Li$_{1-x}$BC compounds where high temperature superconductivity has been predicted for high hole-doping ranges (see, H. Rosner, A. Kitaigorodsky, and W. E. Pickett, Phys. Rev. Lett. 88, 127001 (2002), incorporated herein by reference). FIG. 1 and FIG. 2 generally illustrate the structure of the LiBC material, shown in two and three dimensions, respectively. Synthesis of the LiBC using sealed niobium ampoules has been reported by Wörle et al. (see, M. Wörle, R. Nesper, G. Mair, M. Schwarz, and H. G. von Schnering, Z. Anorg. Allg. Chem. 621, 1153 (1995), incorporated herein by reference), along with initial characterizations. The parent compound LiBC forms a hexagonal lattice with space group P6$_3$/mmc. The B—C layers are fully intercalated, with half of the boron ions on alternating sites replaced by carbon ions, both in-plane and along the c-axis (see, M. Wörle, R. Nesper, G. Mair, M. Schwarz, and H. G. von Schnering, Z. Anorg. Allg. Chem. 621, 1153 (1995); M. Wörle and R. Nesper, J. Alloys Compounds 216, 75 (1994); both of which are incorporated herein by reference). Lithium ions occupy the interstices between the parallel B—C layers.

To explore any superconducting behavior in the Li$_{1-x}$BC compounds, it is essential to achieve clean phases. This is challenging since lithium can be combined with practically every element on the periodic table to form thermodynamically stable compounds (except with the other alkali metals) due to its high electron affinity and strong polarizing power (see, R. Nesper, Prog. Solid. St. Chem. 20, 1 (1990), incorporated herein by reference). The presence of impurity phases, as noted in the early study (see, M. Wörle, R. Nesper, G. Mair, M. Schwarz, and H. G. von Schnering, Z. Anorg. Allg. Chem. 621, 1153 (1995), incorporated herein by reference) can greatly complicate the investigation. Complications increase dramatically in response to magnetism. Another potential complication is the reported weak ferromagnetism in related CaB$_2$C$_2$ (see, J. Akimitsu, K. Takenawa, K. Suzuki, H. Harima, and Y. Kuramoto, Science 293, 1125 (2001), incorporated herein by reference) that could mask or destroy superconductivity. A second key issue is the structural stability of LiBC upon Li de-intercalation, especially at high doping regime. The predicted superconductivity depends sensitively on a minimal lattice distortion (see, H. Rosner, A. Kitaigorodsky, and W. E. Pickett, Phys. Rev. Lett. 88, 127001 (2002), incorporated herein by reference) which is yet to be demonstrated explicitly.

Accordingly, a need exists for a method of synthesizing LiBC and Li$_{1-x}$BC that is simple and effective while providing clean phases as outlined above. The present invention satisfies those needs, as well as others, and overcomes the deficiencies of previously developed synthesis methods.

BRIEF SUMMARY OF THE INVENTION

The present invention describes the synthesis of stoichiometric LiBC from a heating process such as resulting from either an arc-melting process or a sealed tantalum ampoule process to produce LiBC. The produced LiBC is a parent compound from which hole-doped Li$_{1-x}$BC may be synthesized. The term stoichiometric in the present invention refers to a compound having a fixed ratio of constituent atoms.

Hole-doped lithium borocarbide Li$_{1-x}$BC is a promising candidate for phonon-mediated high-temperature superconductivity (H. Rosner, A. Kitaigorodsky, and W. E. Pickett, Phys. Rev. Lett. 88, 127001 (2002), incorporated herein by reference). A method of synthesizing stoichiometric LiBC by arc-melting is described, wherein a pellet of uniformly-mixed elemental lithium, boron, and graphite is sufficiently heated in an arc-melting process to trigger a self-propagating exothermic reaction.

A second synthesis method is described wherein uniformly-mixed elemental lithium, boron, and graphite (Li—B—C) are sealed in a tantalum ampoule, which is heated, such as in a heating chamber, under sufficient temperature for a sufficient period of time.

Hole-doped compound Li$_{1-x}$BC ($0 \leq x \leq 0.37$) is described being generated through vacuum de-intercalation from LiBC. It should be appreciated that the hexagonal crystal lattice remains largely intact, with only slight decreases in lattice parameters upon hole-doping. The samples produced are intrinsically diamagnetic and are semiconducting in the 2 K to 300 degree K range studied. Increased hole-doping leads to a color darkening as well as a decrease in resistivity.

An aspect of the invention is the synthesis of stoichiometric LiBC in a more convenient process of arc-melting.

Another aspect of the invention is synthesizing LiBC from a sealed tantalum ampoule.

Another aspect of the invention is de-intercalation of LiBC produced according to the invention to $Li_{1-x}BC$.

A still further aspect of the invention is to provide synthesized LiBC material with clean phases.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DESCRIPTION OF THE PREFERRED EMBODIMENT(S)OF THE INVENTION

Referring more specifically to the drawings, for illustrative purposes the embodiment and results from implementing the present invention are described by the flowcharts and graphs generally shown in FIG. 3 through FIG. 7. It will be appreciated that the apparatus may vary as to configuration and as to details of the parts, and that the method may vary as to the specific steps and sequence, without departing from the basic concepts as disclosed herein.

In the present invention, methods are described for synthesizing $Li_{1-x}BC$ ($0 \leq x \leq 0.37$) using both arc-melting and sealed tantalum ampoule methods, in conjunction with vacuum de-intercalation. In the doping range studied, the hexagonal lattice of LiBC has remained largely intact, and the samples are diamagnetic and semiconducting.

1. Method Embodiments.

Figure 3:
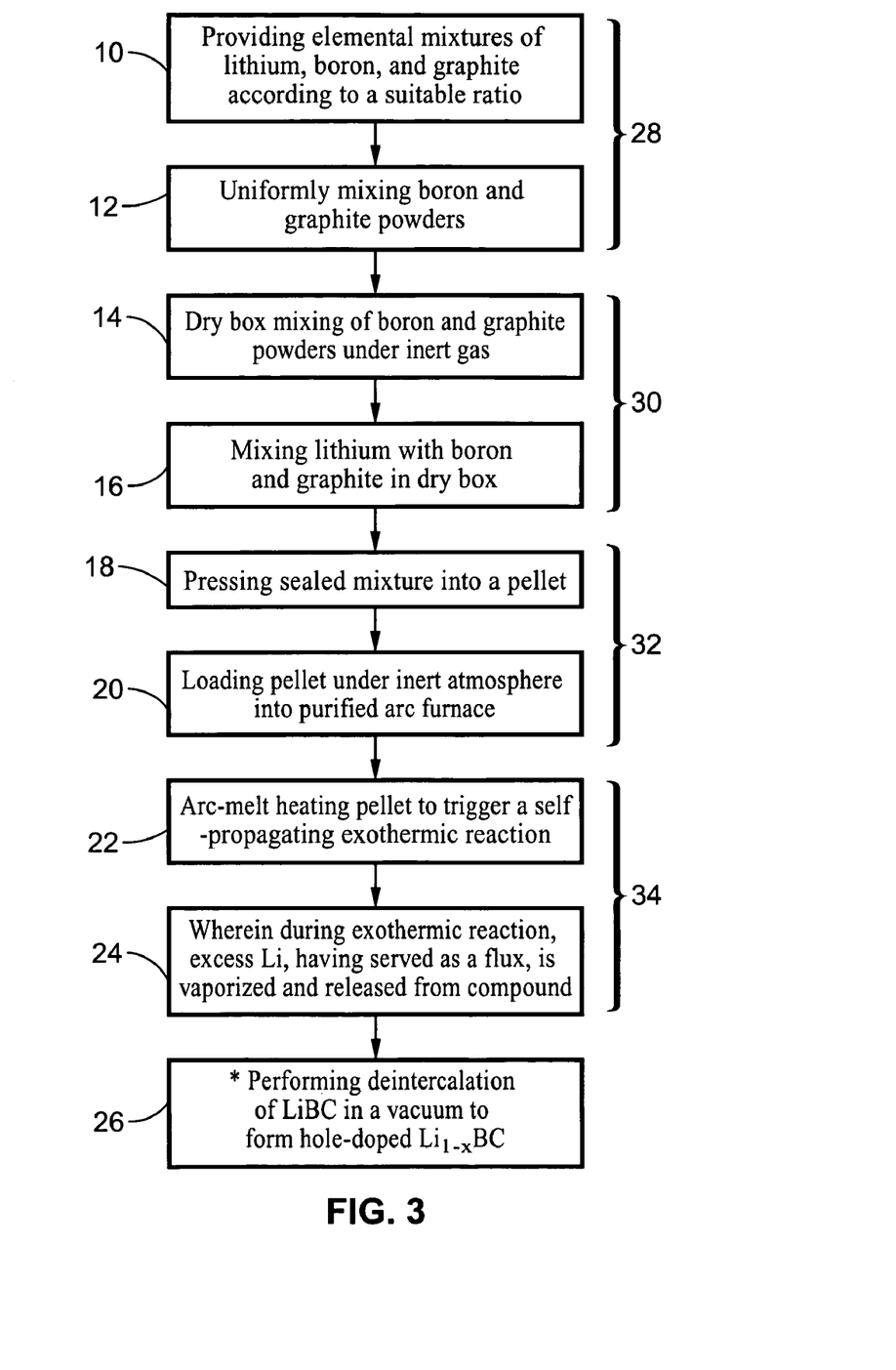
FIG. 3 is a flowchart of arc-melt synthesis of LiBC according to an aspect of the present invention, and shown with an de-intercalation process for generating hole-doped $Li_{1-x}BC$.
Figure 4:
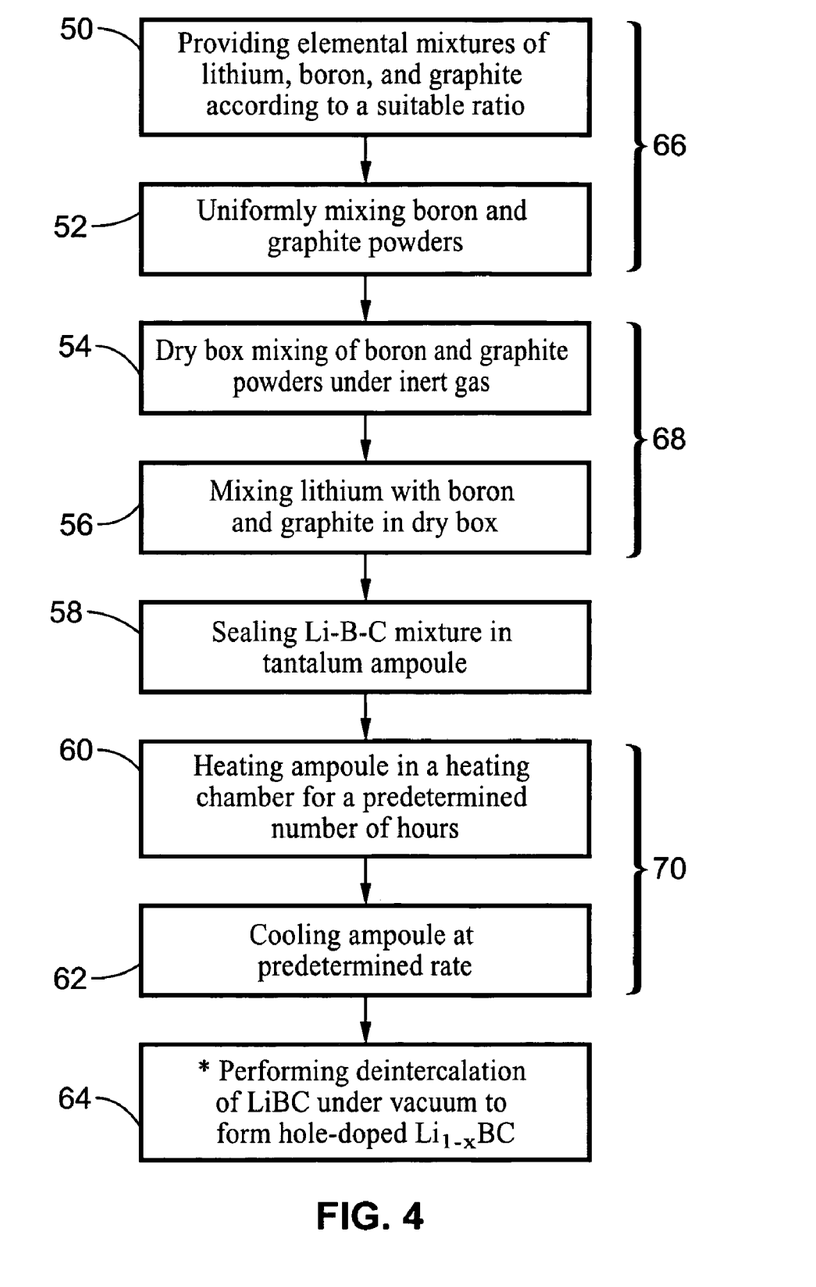
FIG. 4 is a flowchart of tantalum ampoule synthesis of LiBC according to an aspect of the present invention, and shown with an de-intercalation process for generating hole-doped $Li_{1-x}BC$.

FIG. 3 and FIG. 4 describe two generalized processes for synthesizing LiBC parent compound from elemental mixtures, each also describing an optional de-intercalation step for forming $Li_{1-x}BC$.

FIG. 3 describes the method steps in an arc-melting synthesis process according to the present invention. At block 10 elemental mixtures of lithium, boron, and graphite are prepared according to a suitable ratio. These boron and graphite powders are uniformly mixed as per block 12. The boron and graphite are then mixed, such as in a dry box, under an inert gas as given by block 14. The lithium is mixed with the boron and graphite in the dry box as in block 16. The mixture is sealed into a pellet as per block 18 and the pellet is loaded into an arc furnace that has already been purified as represented by block 20. Heating of the pellet is performed so as to trigger a self-propagating exothermic reaction as per block 22. During this exothermic reaction, the excess Li, having served as a flux, is vaporized and released from compound as per block 24. Then if hole-doped $Li_{1-x}BC$ is to be formed, then a de-intercalation process is performed by subjecting the LiBC to de-intercalation under sufficient heat and vacuum as per block 26.

These above steps may be further generalized as:

(a) mixing, uniformly, elemental mixtures of boron (B) and graphite powders (c) according to a suitable ratio under inert gas, as represented by block group 28;

(b) mixing lithium (Li) with boron (B) and graphite (C) under the inert gas, as represented by block group 30;

(c) pressing sealed mixture Li—B—C into a pellet, as represented by block group 32; and (d) arc-melting said Li—B—C pellet to trigger a self-propagating exothermic reaction from which LiBC is created, as represented by block group 34.

FIG. 4 describes the method steps in a tantalum ampoule LiBC synthesis process according to the present invention. At block 50 elemental mixtures of lithium, boron, and graphite are prepared according to a suitable ratio. Boron and graphite powders are uniformly mixed as given by block 52. Boron and graphite powders are mixed under an inert gas, such as according to dry box mixing, as represented by block 54. Lithium is sufficiently mixed with the boron and graphite in a dry box as depicted in block 56. The Li—B—C mixture is sealed within a tantalum ampoule as per block 58. Wherein heating of the ampoule in a heating chamber for a predetermined number of hours as represented by block 60 followed by cooling the ampoule at predetermined rate as per block 62 wherein LiBC is formed. To form hole-doped $Li_{1-x}BC$, a de-intercalation process is performed wherein the LiBC is held under sufficient heat and vacuum to form hole-doped $Li_{1-x}BC$ as given by block 64.

These above steps may be further generalized as:

(a) mixing, uniformly, elemental mixtures of boron (B) and graphite powders (c) according to a suitable ratio under inert gas, as represented by block group 66;

(b) mixing lithium (Li) with boron (B) and graphite (C) under the inert gas, as represented by block group 68;

(c) sealing the Li—B—C in a tantalum ampoule as per block group 58; and (d) heating the tantalum ampoule in a heating chamber under sufficient temperature for a sufficient period of time, as represented by block group 70.

It should be appreciated that in general, a number of synthesis variations may be utilized according to the invention. By way of example, the following describes specific synthesis implementations according to the invention.

2. Specific Implementation Example.

The parent compound LiBC was synthesized from elemental mixtures of lithium (ingot, 99.9%), boron (amorphous, 325 mesh powder, 99.99%), and graphite (200 mesh powder, 99.9999%) according to Li:B:C=1.3:1:1. Boron and graphite powders were first ground together in a mortar for thirty (30) minutes to achieve a uniform mixing. They were then loaded into an argon-filled dry box and thoroughly mixed with lithium for another thirty (30) minutes. The lithium pieces had been freshly cut from an ingot inside the dry box.

In this first approach, arc-melting was used to perform synthesis. The mixture (typically 500–800 mg) was sealed into a 6 mm die and transferred outside the dry box to be pressed into a pellet (under a 3000 psi pressure for 10 minutes). The pellet was subsequently loaded under an argon atmosphere into an arc furnace. The furnace was purged a few times and then refilled with argon gas. Prior to melting the pellet, zirconium was first arc melted to purify the argon. The pellet was then heated up to trigger a self-propagating exothermic reaction, turning the black Li—B—C mixture into a golden LiBC pellet. During the reaction, the excess Li, having served as a flux, was vaporized and released from the compound.

In a second approach, the Li—B—C mixture was sealed in a tantalum ampoule, which was in turn sealed in a quartz tube. The assembly was heated to approximately 1000° C. at 3° C./min and annealed for approximately ten (10) hours before cooling down at about 3° C./min. The annealed powders were mostly golden colored LiBC, however, traces of other black borocarbides were also present.

To achieve the hole-doped $Li_{1-x}BC$, de-intercalation of LiBC was performed under heat in a $10^{-6}$ torr vacuum. For comparison, de-intercalation was carried out at three temperatures for approximately twelve (12) hours each at T=600° C., 700° C. and 800° C., respectively. Before and after the de-intercalation, the mass of each sample was monitored. Care was taken to avoid exposures to air at all steps. The percentage mass loss was 4.7% at 600° C., 5.3% at 700° C. and 8.7% at 800° C. This was accompanied by a color darkening from golden to eventually black at increasingly higher annealing temperatures. From the mass loss, the lithium deficiency can be calculated as x=0.20, 0.23, and 0.37 at 600° C., 700° C., and 800° C., respectively.

3. Results and Discussions.

Structural characterizations of the results were carried out using a Siemens D-500 powder X-ray diffractometer. To accurately determine the lattice parameters, an internal reference (Si powder) has been mixed into the $Li_{1-x}BC$ samples to calibrate any peak position shift. Magnetic measurements were performed by a superconducting quantum interference device (SQUID) magnetometer. Electrical transport was measured by a DC resistivity setup.

Stoichiometric LiBC golden powders are formed by both the described arc-melting and sealed tantalum ampoule methods. In comparison, the self-propagating exothermic reaction in the arc furnace is much more efficient and also leads to more homogeneous LiBC being produced.

Figure 5:
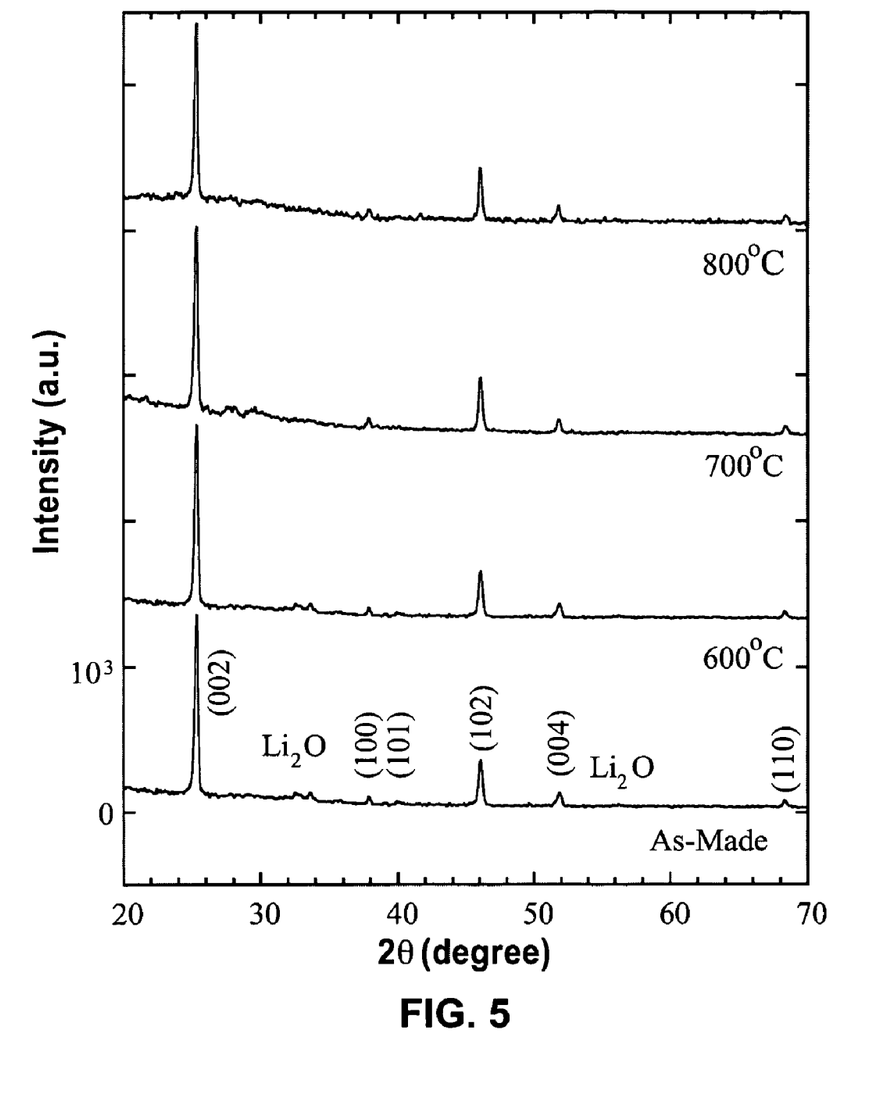
FIG. 5 is a plot of powder x-ray diffraction patterns of the LiBC synthesized by arc-melting and hole-doped $Li_{1-x}BC$ de-intercalated at different temperatures according to an embodiment of the present invention.

FIG. 5 depicts the X-ray diffraction pattern of the LiBC made by the arc-melting process of the invention. It should be noted, however, that traces of $Li_2O$ phases are present in the sample, due to the residual lithium that was not completely released during the exothermic reaction. Such excess lithium could also lead to lithium hydroxide hydrate if left in a damp environment.

The lithium-deficient $Li_{1-x}BC$ samples are very difficult to synthesize directly from either arc-melting or sealed tantalum ampoule method. When starting from stoichiometric mixture of $Li_{1-x}$—B—C, both methods led to mostly unreacted B—C and a minor amount of LiBC. Instead, synthesis was started from the parent LiBC compound and used the vacuum de-intercalation method described above.

In the following, the hole-doped samples deintercalated from the arc melted LiBC are examined. The X-ray diffraction patterns are also shown in FIG. 5. Interestingly, despite the apparent mass loss and color change after the annealing, the change of the LiBC hexagonal lattice is not obvious. Using Si as an internal reference, the diffraction peak positions and extracted lattice parameters have been carefully determined. The as-made LiBC sample after arc-melting has lattice parameters a=2.744 Å and c=7.051 Å. After de-intercalation at 600° C., $Li_{0.80}BC$ has a=2.745 Å and c=7.020 Å. Similarly, $Li_{0.77}BC$ has a=2.740 Å and c=7.027 Å, and $Li_{0.63}BC$ has a=2.740 Å and c=7.028 Å.

Figure 6:
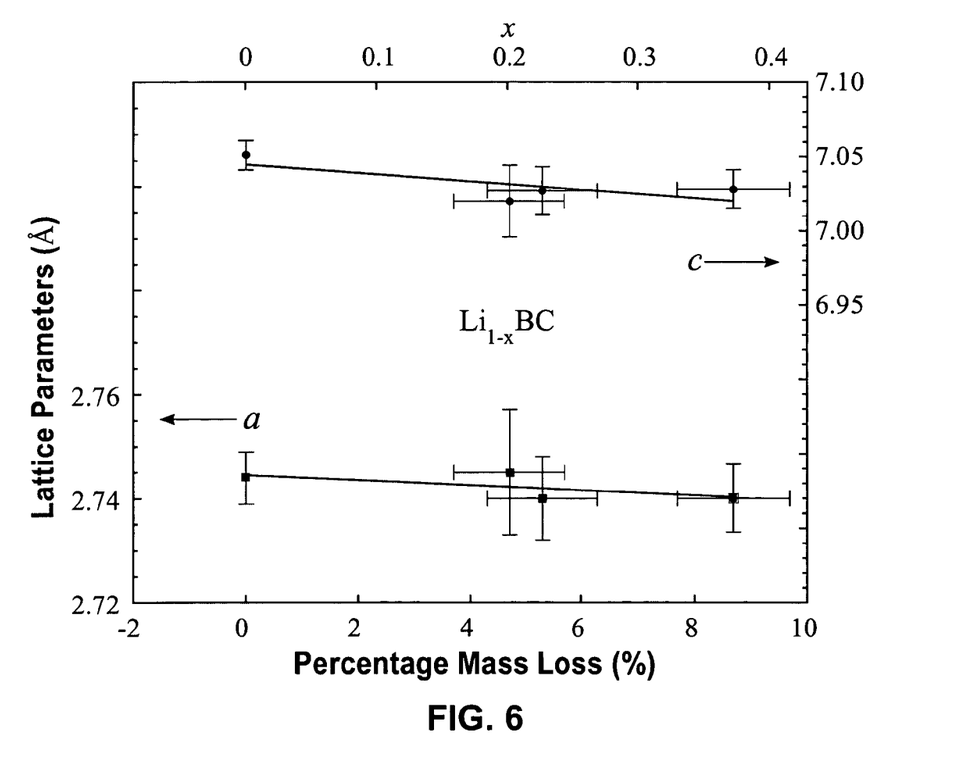
FIG. 6 is a plot of lattice parameters a and c of $LI_{1-x}BC$ as a function of mass loss and hole doping x according to an aspect of the present invention, shown with solid lines for least square fits.

FIG. 6 depicts lattice parameters which have largely remained unchanged in the doping range studied. Least square fits to a and c (solid lines) indicate only a small decrease in the unit cell size upon doping. It will be noted that the vertical error bars represent the uncertainties in the peak positions, while the horizontal error bars represent errors in determining the mass change, including that caused by the $Li_2O$ traces.

Magnetic and transport measurements on the $Li_{1-x}BC$ ($0 \leq x \leq 0.37$) samples have not shown any definitive evidence of superconductivity down to 2 degrees K. Instead, in earlier experiments, a weak ferromagnetism was observed in these samples. The saturation magnetization was up to $5 \times 10^{-2}$ emu/g, or about 2 emu/mole, of the same order of magnitude as that seen in $CaB_2C_2$ (see, J. Akimitsu, K. Takenawa, K. Suzuki, H. Harima, and Y. Kuramoto, Science 293, 1125 (2001), incorporated herein by reference). Here the magnetic signal was not intrinsic to $Li_{1-x}BC$, but rather caused by impurities in the starting materials of boron and carbon that were 99.5%–99.9% pure. After replacing them with higher purity ones (99.99% boron and 99.9999% carbon), along with careful sample handling to avoid magnetic contaminations, the saturation magnetization has become routinely below $4 \times 10^{-3}$ emu/g, or 0.1 emu/mole. The suppression of the ferromagnetic impurities has revealed clear diamagnetic signatures of the $Li_{1-x}BC$ samples. At 5 K, the diamagnetic susceptibility is about $-3 \times 10^{-6}$ emu/gOe.

Figure 7:
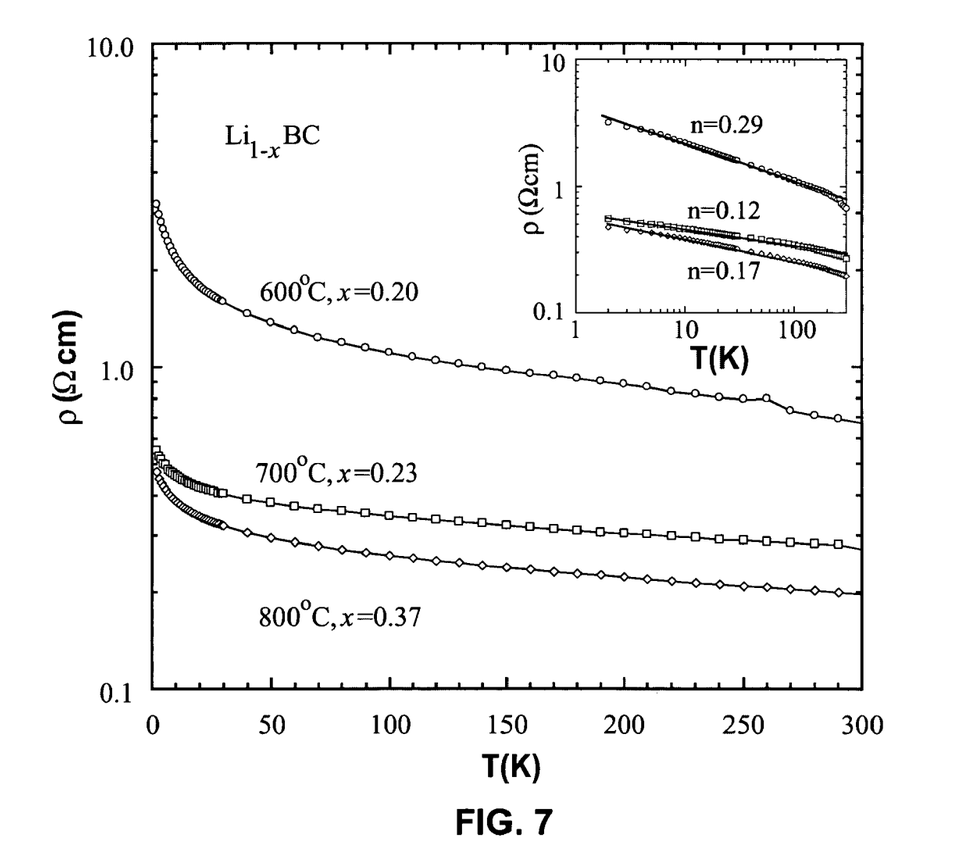
FIG. 7 is a plot of resistivity (p) as a function of temperature (T) for the three $Li_{1-x}BC$ samples deintercalated at 600° C., 700° C., and 800° C. according to an aspect of the present invention, shown with inset of same curves replotted in log—log scale with solid lines being fits to $\rho \sim T^{-n}$.

FIG. 7 depicts the temperature dependence of resistivity ρ for the three hole-doped $Li_{1-x}BC$ samples. At any temperature, the value of ρ decreases with increasing hole-doping. For example, at 300 degrees K, ρ decreases from 0.67 Ω-cm in $Li_{0.80}BC$ to 0.27 Ω-cm in $Li_{0.77}BC$ and further to 0.20 Ω-cm in $Li_{0.63}BC$. For each sample, ρ increases gradually with decreasing temperatures, i.e., a negative temperature coefficient. The ratio of ρ(2K) to ρ(300K) is fairly small, in the range of 2–5. Overall, as can be seen in the semi-log plots in FIG. 7, ρ does not follow a thermally activated behavior (in ρ~1/T), nor a variable range hopping model (in ρ~1/T$^{1/4}$). Rather, similar to that seen recently in LiBC (see, A. V. Pronin, K. Pucher, P. Lunkenheimer, A. Krimmel, and A. Loidl, cond-mat/0207299, incorporated by reference herein) ρ follows a phenomenological power law (ln ρ~−nlnT), as shown in the log—log plots in the inset of FIG. 7. The exponent n thus obtained for $Li_{0.80}BC$, $Li_{0.77}BC$, and $Li_{0.63}BC$ is respectively 0.29, 0.12, and 0.17.

4. Summary of LiBC and Hole-Doped $Li_{1-x}BC$ Synthesis.

In summary, the synthesis of stoichiometric LiBC has been described by both arc furnace melting and sealed tantalum ampoule methods. It will be appreciated that the arc-melting technique results in a self-propagating exothermal reaction, with excess Li being released. A color change arises in the black pellets of material, wherein the color shifts to a homogenous golden color. The sealed Ta ampoule technique is doubly sealed in quartz and annealed at about 1000° C. for approximately ten hours ramping rate 3° C./minute. The result after annealing is a mostly golden color powder.

It should be recognized that hole-doped $Li_{1-x}BC$ is difficult to achieve directly from these two techniques, but can be realized by vacuum de-intercalation of the parent LiBC compound. With increasing hole-doping ($0 \leq x \leq 0.37$), the LiBC color darkens, the hexagonal lattice has only slight decreases in lattice parameters, and the electrical resistivity decreases. These samples are diamagnetic and semiconducting.

Stoichiometric LiBC has been synthesized using both arc-melting and sealed tantalum ampoule methods. Hole-doped $Li_{1-x}BC$ ($0<x \leq 0.37$) compounds have been realized through vacuum de-intercalation from LiBC. The hexagonal crystal lattice has remained largely intact, with only slight decreases in lattice parameters upon hole-doping. The samples are intrinsically diamagnetic and are semiconducting in the 2–300 K range studied. Increased hole-doping leads to a color darkening as well as a decrease in resistivity.

To further adjust the electronic structure of $Li_{1-x}BC$ ($0 \leq x<1$), one may grow thin films of $Li_{1-x}BC$ over a substrate and utilize the strain caused by the substrate to induce superconductivity. Typical thin film synthesis techniques, such as evaporation, sputtering, pulsed laser deposition, pulsed electron deposition, molecular beam epitaxy, and electrochemical deposition may be utilized. Different substrates, with a similar crystal structure to that of LiBC, may be used to induce compressive, tensile, or zero strain. These induced strains modify the electronic structure of the $Li_{1-x}BC$ and can in some cases induce superconductivity.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for".

What is claimed is:

1. A method for synthesizing stoichiometric LiBC comprising the steps:
   a) uniformly-mixing elemental lithium, boron, and graphite;
   b) heating said uniform-mixture in an inert atmosphere by a procedure selected from a group consisting of arc-melting a pellet formed from said uniform-mixture, thereby triggering a self-propagating exothermic reaction, and heating said uniform-mixture in a sealed tantalum ampoule.

2. A synthesis method according to claim 1, wherein said heating procedure comprises said arc-melting of said pellet formed from said uniform-mixture, thereby triggering said self-propagating exothermic reaction.

3. A synthesis method according to claim 1, wherein said heating procedure comprises said heating of said uniform-mixture in said sealed tantalum ampoule.

4. A synthesis method according to claim 1, further comprising the step of forming hole-doped $Li_{1-x}BC$ from said stoichiometric LiBC through vacuum de-intercalation, wherein $0 \leq x<1$.

5. A method of synthesizing stoichiometric LiBC, comprising the steps:
   a) mixing, uniformly, elemental mixtures of boron (B) and graphite (C) powders with lithium (Li) under said inert gas;
   b) pressing said mixture of Li—B—C into a pellet; and
   c) arc-melting said Li—B—C pellet to trigger a self-propagating exothermic reaction, thereby producing the LiBC.

6. A synthesis method according to claim 5, wherein said lithium is present in an excess amount, whereby said excess amount of lithium serves as a flux, vaporizes, and is released during said self-propagating exothermic reaction.

7. A synthesis method as recited in claim 5, further comprising the step of forming hole-doped $Li_{1-x}BC$ through vacuum de-intercalation, wherein $0 \leq x \leq 1$.

8. A synthesis method according to claim 7, wherein said de-intercalation is performed in a vacuum of at least approximately $10^{-6}$ torr.

9. A synthesis method according to claim 7, wherein said vacuum de-intercalation is performed for a time period of between approximately five minutes to approximately one hundred hours.

10. A synthesis method according to claim 7, where said vacuum de-intercalation is carried out at a temperature of between approximately 600° C. to approximately 1200° C.

11. A synthesis method according to claim 7, further comprising the step of adjusting the structure of said $Li_{1-x}BC$ by forming thin films of said $Li_{1-x}BC$ over a substrate, wherein stress induced on said substrate alters said $Li_{1-x}BC$'s electronic structure.

12. A synthesis method according to claim 5, wherein said lithium, boron, and carbon are mixed in a ratio of approximately 1.3:1:1, respectively.

13. A method of synthesizing stoichiometric LiBC, comprising the steps:
   a) mixing, uniformly, elemental mixtures of boron (B) and graphite (C) powders with lithium (Li) under said inert gas;
   b) sealing said mixture of Li—B—C in a tantalum ampoule; and
   c) heating said tantalum ampoule in a heating chamber.

14. A synthesis method according to claim 13, wherein said tantalum ampoule heating comprises the steps:
   a) heating to approximately 1000° C. and
   b) annealing for approximately 10 hours.

15. A synthesis method according to claim 13, further comprising the step of cooling said heated and annealed tantalum ampoule at a cooling rate of approximately 3° C./min.

16. A synthesis method according to claim 13, further comprising the step of forming hole-doped $Li_{1-x}BC$ through vacuum de-intercalation, wherein $0 \leq x \leq 1$.

17. A synthesis method according to claim 16, wherein said vacuum is set to at least approximately $10^{-6}$ torr and said de-intercalation is performed for a time period of between approximately five minutes to approximately one hundred hours at approximately 600° C. to approximately 1200° C.

18. A synthesis method according to claim 16, further comprising the step of adjusting the structure of said $Li_{1-x}BC$ by forming thin films of said $Li_{1-x}BC$ over a substrate, wherein stress induced on said substrate alters said $Li_{1-x}BC$'s electronic structure.

19. A synthesis method according to claim 13, wherein said lithium, boron, and carbon are mixed in a ratio of approximately 1.3:1:1, respectively.

20. A method of synthesizing LiBC, comprising the steps:
    a) obtaining elemental lithium (Li), boron (B), and graphite (C);
    b) uniformly mixing said B and said C;
    c) placing said uniform mixture of B and C into an inert gas atmosphere;
    d) mixing Li into said uniform mixture of B and C under said inert gas atmosphere;
    e) pressing said Li, B, and C mixture into a pellet; and
    f) heating said pellet to trigger a self-propagating exothermic reaction, thereby producing the LiBC.

21. A synthesis method according to claim 20, wherein said Li, B, and C mixture ratio for Li:B:C ranges from an approximately equal ratio of about 1:1:1, respectively, to a ratio with excess Li.

22. A synthesis method according to claim 20, wherein said Li, B, and C mixture ratio for Li:B:C is approximately 1.3:1:1, respectively.

23. A synthesis method according to claim 20, wherein said lithium, boron, and graphite all have a purity at or above 99.9%.

24. A synthesis method according to claim 20, wherein said boron comprises a powder of approximately 325 mesh.

25. A synthesis method according to claim 20, wherein said graphite comprises a powder of approximately 200 mesh.

26. A synthesis method according to claim 20, wherein said inert gas comprises argon gas or helium gas.

27. A synthesis method according to claim 20, wherein said lithium comprises pieces freshly cut from an ingot under said inert gas atmosphere.

28. A synthesis method according to claim 20, wherein said pressing comprises the steps:
    a) sealing said Li, B, and C mixture into a die;
    b) transferring said Li, B, and C mixture out from under said inert gas atmosphere and into a press mechanism; and
    c) pressing said Li, B, and C mixture into said pellet.

29. A synthesis method according to claim 28, wherein said pressing of said Li, B, and C mixture into said pellet comprises applying pressure over a period of time.

30. A synthesis method according to claim 29, wherein said applied pressure is approximately 3000 pounds-per-square inch (psi) for approximately 10 minutes to a 6 mm die within said press mechanism.

31. A synthesis method according to claim 20, wherein said heating of said pellet to trigger said exothermal reaction, comprises the steps:
    a) purging impurities from an arc furnace;
    b) arc-melting of zirconium in said arc furnace to purify an inert gas atmosphere within said arc furnace;
    c) loading said pellet under said inert gas atmosphere into said arc furnace; and
    d) heating said pellet under said inert gas atmosphere to trigger said exothermal reaction.

32. A synthesis method according to claim 31, wherein said purging comprises argon gas-type purging followed by filling of said arc furnace with argon gas.

33. A synthesis method according to claim 21, wherein during said exothermic reaction, said excess Li, having served as a flux, is vaporized and released.

34. A synthesis method according to claim 20, further comprising the step of forming hole-doped $Li_{1-x}BC$ in a de-intercalation process under vacuum, wherein $0 \leq x \leq 1$.

35. A synthesis method according to claim 34, wherein said vacuum during said de-intercalation is at least approximately $10^{-6}$ torr and wherein said de-intercalation is performed in the range of approximately five minutes to approximately one hundred hours at a temperature range of about 600° C. to about 1200° C.

36. A synthesis method according to claim 34, further comprising the step of adjusting the structure of said $Li_{1-x}BC$ by forming thin films of said $Li_{1-x}BC$ over a substrate, wherein stress induced on said substrate alters said $Li_{1-x}BC$'s electronic structure.

37. A method of synthesizing LiBC, comprising the steps:
    a) preparing elemental mixtures of lithium (Li), powdered boron (B), and powdered graphite (C);
    b) uniform mixing said powders of B and C;
    c) loading said uniform mixture of powered B and C into a dry box filled with inert gas;
    d) mixing said dry box contained uniform mixture of powered B and C with Li;
    e) sealing said mixture of Li, B, and C in a tantalum ampoule; and
    f) heating the ampoule to produce the LiBC.

38. A synthesis method according to claim 37, wherein said Li, B, and C mixture ratio for Li:B:C ranges from an approximately equal ratio of about 1:1:1, respectively, to a ratio with excess Li.

39. A synthesis method according to claim 37, wherein said Li, B, and C are mixed in a ratio of approximately 1.3:1:1, respectively.

40. A synthesis method according to claim 37, wherein said lithium, boron, and graphite all have a purity at or above 99.9%.

41. A synthesis method according to claim 37, wherein said boron comprises a powder of approximately 325 mesh.

42. A synthesis method according to claim 37, wherein said graphite comprises a powder of approximately 200 mesh.

43. A synthesis method according to claim 37, wherein said inert gas comprises argon gas or helium gas.

44. A synthesis method according to claim 37, wherein said lithium comprises pieces freshly cut from an ingot in said dry box under said inert gas atmosphere.

45. A synthesis method according to claim 37, wherein said heating comprises heating said ampoule to approximately 1000° C. at approximately three ° C./min and annealing for approximately ten hours.

46. A synthesis method according to claim 37, further comprising cooling of said ampoule at a fixed rate.

47. A synthesis method according to claim 46, wherein said fixed cooling rate is approximately three ° C./minute.

48. A synthesis method according to claim 37, further comprising the step of forming hole-doped $Li_{1-x}BC$ in a de-intercalation process under vacuum, wherein $0 \leq x < 1$.

49. A synthesis method according to claim 48, wherein said vacuum during said de-intercalation is at least approximately $10^{-6}$ torr and wherein said de-intercalation is performed in the range of approximately five minutes to approximately one hundred hours at a temperature range of about 600° C. to about 1200° C.

50. A synthesis method according to claim 48, further comprising the step of adjusting the structure of said $Li_{1-x}BC$ by forming thin films of said $Li_{1-x}BC$ over a substrate, wherein stress induced on said substrate alters said $Li_{1-x}BC$'s electronic structure.

51. A synthesis method according to claim 50, wherein said stress-induced electronic structure alteration controls superconductivity of said $Li_{1-x}BC$.

52. A synthesis method according to claim 50, wherein said thin film formation is by a process selected from a group consisting of thin-film deposition techniques consisting of evaporation, sputtering, pulsed laser deposition, pulsed electron deposition, molecular beam epitaxy, and electrochemical deposition.

53. A synthesis method according to claim 50, wherein said substrate has a similar crystal structure to that of LiBC toward inducing compressive, tensile, or zero strain.

* * * * *